US009871130B2

(12) United States Patent
Tanaka

(10) Patent No.: US 9,871,130 B2
(45) Date of Patent: Jan. 16, 2018

(54) NITRIDE SEMICONDUCTOR DEVICE AND MANUFACTURING METHOD THEREOF

(71) Applicant: ROHM CO., LTD., Kyoto (JP)

(72) Inventor: Taketoshi Tanaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/273,336

(22) Filed: Sep. 22, 2016

(65) Prior Publication Data

US 2017/0104091 A1 Apr. 13, 2017

(30) Foreign Application Priority Data

Oct. 8, 2015 (JP) ................................ 2015-200549

(51) Int. Cl.
| | |
|---|---|
| *H01L 29/778* | (2006.01) |
| *H01L 21/8252* | (2006.01) |
| *H01L 29/66* | (2006.01) |
| *H01L 29/20* | (2006.01) |

(52) U.S. Cl.
CPC ...... *H01L 29/7787* (2013.01); *H01L 21/8252* (2013.01); *H01L 29/2003* (2013.01); *H01L 29/66431* (2013.01); *H01L 29/66462* (2013.01)

(58) Field of Classification Search
CPC ............. H01L 21/2036; H01L 21/2056; H01L 21/2085; H01L 21/8252; H01L 29/2003; H01L 29/42316; H01L 29/432; H01L 29/454; H01L 29/66431; H01L 29/66462; H01L 29/66916; H01L 29/7783; H01L 29/7787
See application file for complete search history.

(56) References Cited

U.S. PATENT DOCUMENTS

| | | | |
|---|---|---|---|
| 9,190,506 B2* | 11/2015 | Tanimoto | ............... H01L 29/432 |
| 2007/0176203 A1* | 8/2007 | Kuramoto | .............. B82Y 20/00 |
| | | | 257/192 |
| 2012/0025205 A1* | 2/2012 | Nakata | .............. H01L 21/02378 |
| | | | 257/77 |
| 2013/0292690 A1* | 11/2013 | Ando | .................... H01L 29/432 |
| | | | 257/76 |
| 2014/0091316 A1* | 4/2014 | Kikkawa | ........... H01L 29/66462 |
| | | | 257/76 |

(Continued)

FOREIGN PATENT DOCUMENTS

JP 2006-339561 A 12/2006

*Primary Examiner* — Stephen W Smoot
(74) *Attorney, Agent, or Firm* — Rabin & Berdo, P.C.

(57) ABSTRACT

A nitride semiconductor device includes: a first nitride semiconductor layer serving as an electron transit layer; a second nitride semiconductor layer formed on the first nitride semiconductor layer, the second nitride semiconductor layer having a band gap greater than that of the first nitride semiconductor layer and serving as an electron supply layer; a third nitride semiconductor layer formed on the second nitride semiconductor layer, the third nitride semiconductor layer having a band gap greater than that of the first nitride semiconductor layer and smaller than that of the second nitride semiconductor layer; and a gate part formed on the third nitride semiconductor layer, wherein the gate part has a fourth nitride semiconductor layer formed on the third nitride semiconductor layer and includes an acceptor type impurity, and a gate electrode formed on the fourth nitride semiconductor layer.

18 Claims, 12 Drawing Sheets

(56) References Cited

U.S. PATENT DOCUMENTS

| | | | | |
|---|---|---|---|---|
| 2014/0264441 A1* | 9/2014 | Murase | ............ | H01L 29/66462 |
| | | | | 257/190 |
| 2015/0318387 A1* | 11/2015 | Chiu | ................... | H01L 23/291 |
| | | | | 257/76 |
| 2015/0372125 A1* | 12/2015 | Kotani | ............... | H01L 29/7787 |
| | | | | 257/194 |

* cited by examiner

1A

101

1B

NITRIDE SEMICONDUCTOR DEVICE AND MANUFACTURING METHOD THEREOF

CROSS-REFERENCE TO RELATED APPLICATION(S)

This application is based upon and claims the benefit of priority from Japanese Patent Application No. 2015-200549, filed on Oct. 8, 2015, the entire contents of which are incorporated herein by reference.

TECHNICAL FIELD

The present disclosure relates to a nitride semiconductor device including a group-III nitride semiconductor (hereinafter, simply referred to as a "nitride semiconductor"), and a manufacturing method thereof.

BACKGROUND

A group-III nitride semiconductor is a semiconductor using nitrogen as a group-V element in group III-V semiconductors. An aluminum nitride (AlN), a gallium nitride (GaN), an indium nitride (InN) are typical examples of the group-III nitride semiconductor. In general, the group-III nitride semiconductor may be expressed as $Al_xIn_yGa_{1-x-y}N$ (where $0 \le x \le 1$, $0 \le y \le 1$, and $0 \le x+y \le 1$).

A high electron mobility transistor (HEMT) using such a nitride semiconductor has been proposed. The HEMT includes, for example, an electron transit layer made of GaN and an electron supply layer made of AlGaN epitaxially grown on the electron transit layer. A pair of electrodes (e.g. source electrode and drain electrode) is formed to be in contact with the electron supply layer, and a gate electrode is disposed therebetween. The gate electrode is disposed to face the electron supply layer with an insulating film disposed therebetween. Due to the polarization caused by the lattice mismatch of GaN and AlGaN, a two-dimensional (2D) electron gas is formed in an inward position by a few Å from an interface between the electron transit layer and the electron supply layer, within the electron transit layer. The source and the drain are connected through the 2D electron gas as a channel. When the 2D electron gas is blocked by applying a control voltage to the gate electrode, the source and the drain are disconnected from each other. In a state where the control voltage is not applied to the gate electrode, the source and the drain are conducted, forming a normally ON type device.

Since a device using a nitride semiconductor has characteristics such as a high voltage, a high temperature operation, a large current density, high speed switching, and a low on-resistance, the applications to power devices have been studied.

However, in order to be used as a power device, since it is required to be a normally OFF type device in which a current is cut off at the time of zero biasing, the aforementioned HEMT cannot be applied to the power device.

A structure for realizing a normally OFF type nitride semiconductor HEMT has been proposed.

An example for achieving a normally OFF scheme has a configuration in which a p-type GaN layer is stacked on an AlGaN electron supply layer, a gate electrode is disposed thereon, and a channel is lost by a depletion layer spreading from the p-type GaN layer.

When a semiconductor device having the above described configuration is manufactured, the p-type GaN layer is formed on the AlGaN electron supply layer and a gate electrode film is formed on the p-type GaN layer. Thereafter, the p-type GaN layer and the gate electrode film are selectively etched, thereby forming a gate part including the p-type GaN layer and the gate electrode. In the above semiconductor device, high precision is required to obtain the proper etching depth during a gate part forming process.

The reason is as follows. When the p-type GaN layer and the gate electrode film are selectively etched, if even the AlGaN electron supply layer is etched, a thickness of the electron supply layer is reduced, and therefore, the polarization of the electron supply layer is reduced to reduce a 2D electron gas density. On the other hand, even when the p-type GaN layer remains in a region other than a region directly below the gate part, the 2D electron gas density is also reduced. That is to say, the 2D electron gas density is significantly varied depending on an etching depth during the gate part forming process. Therefore, a high precision is required to obtain the proper etching depth during the gate part forming process.

SUMMARY

The present disclosure provides some embodiments of a nitride semiconductor device capable of reducing the etching depth precision required during a gate part forming process, and a manufacturing method thereof.

According to one embodiment of the present disclosure, there is provided a nitride semiconductor device, including: a first nitride semiconductor layer serving as an electron transit layer; a second nitride semiconductor layer formed on the first nitride semiconductor layer, the second nitride semiconductor layer having a band gap greater than that of the first nitride semiconductor layer and serving as an electron supply layer; a third nitride semiconductor layer formed on the second nitride semiconductor layer, the third nitride semiconductor layer having a band gap greater than that of the first nitride semiconductor layer and smaller than that of the second nitride semiconductor layer; and a gate part formed on the third nitride semiconductor layer, wherein the gate part has a fourth nitride semiconductor layer formed on the third nitride semiconductor layer and includes an acceptor type impurity, and a gate electrode formed on the fourth nitride semiconductor layer.

In this configuration, the third nitride semiconductor layer having a band gap greater than that of the first nitride semiconductor layer and smaller than that of the second nitride semiconductor layer is formed on the second nitride semiconductor layer serving as an electron supply layer, and the gate part is formed thereon. Thus, it is possible to reduce the etching depth precision required during a gate part forming process.

In some embodiments, the third nitride semiconductor layer is formed in a region directly below the gate part on the second nitride semiconductor layer and in at least a portion of a region other than the region directly below the gate part on the second nitride semiconductor layer.

In some embodiments, a thickness of the third nitride semiconductor layer formed in at least a portion of the region other than the region directly below the gate part is smaller than that of the third nitride semiconductor layer formed in the region directly below the gate part.

In some embodiments, the third nitride semiconductor layer is formed only in a region directly below the gate part on the second nitride semiconductor layer.

In some embodiments, the first nitride semiconductor layer is formed of a GaN layer, the second nitride semiconductor layer is formed of an AlGaN layer, the third nitride semiconductor layer is formed of an AlGaN layer having an Al composition higher than that of the second nitride semiconductor layer, and the fourth nitride semiconductor layer is formed of a p-type GaN layer.

In some embodiments, the first nitride semiconductor layer is formed of a GaN layer, the second nitride semiconductor layer is formed of an AlGaN layer, the third nitride semiconductor layer is formed of an AlInGaN layer, and the fourth nitride semiconductor layer is formed of a p-type GaN layer.

In some embodiments, the device further includes an insulating film configured to cover the third nitride semiconductor layer, the fourth nitride semiconductor layer, and the gate electrode, wherein the insulating film contains Si as a constituent element and includes a layer in contact with the third nitride semiconductor layer.

In some embodiments, the first nitride semiconductor layer includes a first acceptor type impurity having a concentration of $4 \times 10^{16}$ cm$^{-3}$ or greater. In some embodiments, the first acceptor type impurity is carbon.

In some embodiments, the fourth nitride semiconductor layer includes a second acceptor type impurity having a concentration of $3 \times 10^{17}$ cm$^{-3}$ or greater. In some embodiments, the second acceptor type impurity is carbon or magnesium.

In some embodiments, the device further includes a low-k film formed on the gate electrode and formed of a dielectric material having a dielectric constant of 5 or less.

In some embodiments, the second nitride semiconductor layer is formed of an $Al_{x1}Ga_{1-x1}N$ layer (where 0<x1<1); and the third nitride semiconductor layer is formed of an $Al_{x2}Ga_{1-x2}N$ layer, wherein x2 is a value within a range of x⅓≤x2≤2·x⅓.

In some embodiments, the second nitride semiconductor layer is formed of an $Al_{x1}Ga_{1-x1}N$ layer; and the third nitride semiconductor layer is formed of an $Al_{x2}Ga_{1-x2}N$ layer, wherein x1 is a value within a range of 0.15≤x1≤0.3, and x2 is a value within a range of 0.05≤x2≤0.2.

In some embodiments, a film thickness of the second nitride semiconductor layer ranges 10 nm to 20 nm; and a film thickness of the third nitride semiconductor layer is 20 nm or less.

According to another embodiment of the present disclosure, there is provided a method of manufacturing a nitride semiconductor device, including: forming a first nitride semiconductor layer as an electron transit layer; forming a second nitride semiconductor layer as an electron supply layer on the first nitride semiconductor layer, and the second nitride semiconductor layer having a band gap greater than that of the first nitride semiconductor layer; and forming a third nitride semiconductor layer on the second nitride semiconductor layer, the third nitride semiconductor layer having a band gap greater than that of the first nitride semiconductor layer and smaller than that of the second nitride semiconductor layer; and forming a fourth nitride semiconductor layer including an acceptor type impurity on the third nitride semiconductor layer; forming a gate electrode film on the fourth nitride semiconductor layer; and forming a gate part including the fourth nitride semiconductor layer and a gate electrode on the third nitride semiconductor layer by selectively etching the gate electrode film, the fourth nitride semiconductor layer, and the third nitride semiconductor layer.

In this configuration, since the gate part is formed by selectively etching the gate electrode film, the fourth nitride semiconductor layer, and the third nitride semiconductor layer, it is possible to reduce the etching depth precision required during the gate part forming process.

In some embodiments, in the act of forming a gate part, etching is performed up to the middle of the third nitride semiconductor layer in a thickness direction from a surface of the electrode film.

In some embodiments, the method further includes: after the act of forming a gate part, forming an insulating film configured to cover the third nitride semiconductor layer and the gate part; forming a source electrode contact hole and a drain electrode contact hole in the insulating film; forming a source/drain electrode film in the source electrode contact hole and the drain electrode contact hole and on the insulating film; and forming a source electrode and a drain electrode by selectively etching the source/drain electrode film.

DETAILED DESCRIPTION

Embodiments of the present disclosure will now be described in detail with reference to the drawings.

Figure 1:
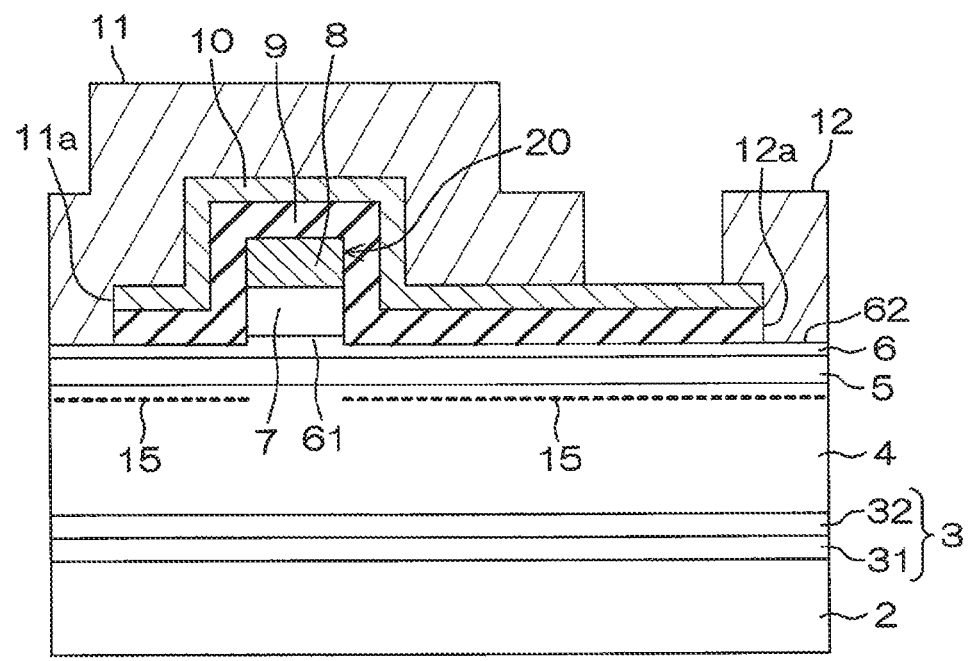
FIG. 1 is a cross-sectional view illustrating the configuration of a nitride semiconductor device according to a first embodiment of the present disclosure.

FIG. 1 is a cross-sectional view illustrating the configuration of a nitride semiconductor device according to a first embodiment of the present disclosure.

A nitride semiconductor device 1 includes a substrate 2, a buffer layer 3 formed on the surface of the substrate 2, a first nitride semiconductor layer 4 epitaxially grown on the buffer layer 3, and a second nitride semiconductor layer 5 epitaxially grown on the first nitride semiconductor layer 4. Further, the nitride semiconductor device 1 includes a third nitride semiconductor layer 6 epitaxially grown on the second nitride semiconductor layer 5 and a gate part 20 formed on the third nitride semiconductor layer 6. The gate part 20 includes a fourth nitride semiconductor layer 7 epitaxially grown on the third nitride semiconductor layer 6 and a gate electrode 8 formed on the fourth nitride semiconductor layer 7.

In addition, the nitride semiconductor device 1 includes a passivation film 9 that covers the third nitride semiconductor layer 6 and the gate part 20 and a barrier metal film 10 stacked on the passivation film 9. Further, the nitride semiconductor device 1 includes a source electrode 11 and a drain electrode 12 that are in ohmic-contact with the third nitride semiconductor layer 6 through a source electrode contact hole 11a and a drain electrode contact hole 12a formed in a stacked film of the passivation film 9 and the barrier metal film 10. The source electrode 11 and the drain electrode 12 are disposed to be spaced apart from each other. The source electrode 11 is formed to cover the gate part 20.

The substrate 2 may be, for example, a low resistance silicon substrate. The low resistance silicon substrate may have an impurity concentration ranging, for example, from $1 \times 10^{17}$ cm$^{-3}$ to $1 \times 10^{20}$ cm$^{-3}$ (more specifically, about $1 \times 10^{18}$ cm$^{-3}$). Also, the substrate 2 may be a low resistance GaN substrate or a low resistance SiC substrate, as well as the low resistance silicon substrate.

The buffer layer 3 may be configured as a multilayer buffer layer formed by stacking a plurality of nitride semiconductor films, and have a film thickness of about 0.2 µm. In this embodiment, the buffer layer 3 includes a first buffer layer 31 formed of an AlN film in contact with the surface of the substrate 2 and a second buffer layer 32 formed of an AlGaN film stacked on a surface of the first buffer layer 31 (a surface on the opposite side of the substrate 2). The buffer layer 3 may also be configured as, for example, a single film of AlN.

The first nitride semiconductor layer 4 forms an electron transit layer. In this embodiment, the first nitride semiconductor layer 4 may be formed of a GaN layer doped with an acceptor type impurity and have a thickness of about 1.0 µm. A concentration of the acceptor type impurity is preferably $4 \times 10^{16}$ cm$^{-3}$ or greater. In this embodiment, the acceptor type impurity is carbon (C).

The second nitride semiconductor layer 5 forms an electron supply layer. The second nitride semiconductor layer 5 is formed of a nitride semiconductor having a band gap greater than that of the first nitride semiconductor layer 4. Specifically, the second nitride semiconductor layer 5 is formed of a nitride semiconductor having an Al composition higher than that of the first nitride semiconductor layer 4. In the nitride semiconductor, a band gap is enlarged as the Al composition is higher. In this embodiment, the second nitride semiconductor layer 5 is formed of an $Al_{x1}Ga_{1-x1}N$ layer (where 0<x<1), and has a thickness of about 10 nm. A film thickness of the second nitride semiconductor layer 5 preferably ranges from 10 nm to 20 nm.

In this manner, the first nitride semiconductor layer 4 (electron transit layer) and the second nitride semiconductor layer 5 (electron supply layer) are formed of nitride semiconductors having different band gaps (Al compositions) and a lattice mismatch occurs therebetween. Further, due to spontaneous polarization of the first nitride semiconductor layer 4 and the second nitride semiconductor layer 5 and piezoelectric polarization resulting from the lattice mismatch therebetween, an energy level of a conduction band of the first nitride semiconductor layer 4 becomes lower than a Fermi level in an interface between the first nitride semiconductor layer 4 and the second nitride semiconductor layer 5. As a result, a 2D electron gas (2DEG) 15 is spread in a position (for example, a distance of about a few Å from the interface) near the interface between the first nitride semiconductor layer 4 and the second nitride semiconductor layer 5.

The third nitride semiconductor layer (etching precision reducing layer) 6 is formed of a nitride semiconductor having a band gap greater than that of the first nitride semiconductor layer 4 and smaller than that of the second nitride semiconductor layer 5. In this embodiment, the third nitride semiconductor layer 6 is formed of an $Al_{x2}Ga_{1-x2}N$ layer (where 0<x2<1 and x2<x1) having an Al composition lower than that of the second nitride semiconductor layer 5. In some embodiments, x2 is a value within a range of x⅓≤x2≤2·x⅓. Also, in some embodiments, x1 is a value within a range of 0.15≤x1≤0.3 and x2 is a value within a range of 0.05≤x2≤0.2.

In this embodiment, a film thickness of a portion of the third nitride semiconductor layer 6 directly below the gate part 20 is greater than that of a portion of the third nitride semiconductor layer 6 other than the portion directly below the gate part 20. In the following description, the portion of the third nitride semiconductor layer 6 directly below the gate part 20 may be referred to as a thick portion 61 and the portion of the third nitride semiconductor layer 6 other than the thick portion 61 may be referred to as a thin portion 62. A thickness of the thick portion 61 of the third nitride semiconductor layer 6 may be 10 nm or smaller. In this embodiment, a thickness of the thick portion 61 of the third nitride semiconductor layer 6 is about 10 nm. The third nitride semiconductor layer 6 is installed to reduce the etching depth precision required during the formation of the gate part 20 at the time of manufacturing the nitride semiconductor device 1.

The fourth nitride semiconductor layer 7 is formed on the thick portion 61 of the third nitride semiconductor layer 6. The fourth nitride semiconductor layer 7 is formed of a nitride semiconductor doped with an acceptor type impurity. In this embodiment, the fourth nitride semiconductor layer 7 is formed of a GaN layer (p-type GaN layer) doped with an acceptor type impurity, and has a thickness of about 60 nm. A concentration of the acceptor type impurity may be $3 \times 10^{17}$ cm$^{-3}$ or greater. In this embodiment, the acceptor type impurity is magnesium (Mg). The acceptor type impurity may also be an acceptor type impurity such as carbon (C), other than Mg. The fourth nitride semiconductor layer 7 is installed to cancel out the 2D electron gas 15 generated in the interface between the first nitride semiconductor layer (electron transit layer) 4 and the second nitride semiconductor layer (electron supply layer) 5 in the region directly below the gate part 20.

The gate electrode 8 is formed to be in contact with the fourth nitride semiconductor layer 7. In this embodiment, the gate electrode 8 is formed as a TiN layer and has a thickness of about 100 nm. The gate electrode 8 is disposed to be biased to the source electrode contact hole 11a.

The passivation film 9 covers a surface of the thin portion 62 of the third nitride semiconductor layer 6 (excluding a region facing the contact holes 11a and 12a), side surfaces of the thick portion 61 of the third nitride semiconductor layer 6 and the fourth nitride semiconductor layer 7, and a side surface and a surface of the gate electrode 8. In this embodiment, the passivation film 9 is formed of an SiN film and has a thickness of about 100 nm.

The barrier metal film 10 is stacked on the passivation film 9. In this embodiment, the barrier metal film 10 is formed of a TiN film and has a thickness of about 50 nm.

The source electrode 11 and the drain electrode 12 may have, for example, a lower layer in contact with the third nitride semiconductor layer 6, an intermediate layer stacked on the lower layer, and an upper layer stacked on the intermediate layer. The lower layer may be titanium (Ti) having a thickness of about 20 nm, the intermediate layer may be aluminum (Al) having a thickness of about 200 nm, and the upper layer may be TiN having a thickness of about 50 nm.

In the nitride semiconductor device 1, the second nitride semiconductor layer (electron supply layer) 5 having a different band gap (Al composition) is formed on the first nitride semiconductor layer (electron transit layer) 4 to form a hetero-junction. Thus, the 2D electron gas 15 is formed within the first nitride semiconductor layer 4 near the interface between the first nitride semiconductor layer 4 and the second nitride semiconductor layer 5 and an HEMT using the 2D electron gas 15 as a channel is formed. The gate electrode 8 faces the second nitride semiconductor layer 5 with the fourth nitride semiconductor layer 7 formed of a p-type GaN layer and the thick portion 61 of the third nitride semiconductor layer 6 interposed therebetween. Below the gate electrode 8, the energy levels of the first nitride semiconductor layer 4 and the second nitride semiconductor layer 5 are increased by an ionization acceptor included in the fourth nitride semiconductor layer 7 formed of a p-type GaN layer, and thus, an energy level of a conduction band in the hetero-junction interface becomes higher than a Fermi level. Therefore, the 2D electron gas 15 resulting from the spontaneous polarization of the first nitride semiconductor layer 4 and the second nitride semiconductor layer 5 and the piezoelectric polarization due to the lattice mismatch therebetween is not formed directly below the gate electrode 8 (gate part 20). Thus, when a bias is not applied to the gate electrode 8 (at the time of zero biasing), a channel by the 2D electron gas 15 is blocked directly below the gate electrode 8. In this manner, the normally OFF type HEMT is realized. When an appropriate ON voltage (e.g., 3 V) is applied to the gate electrode 8, a channel is generated directly below the gate electrode 8 within the first nitride semiconductor layer 4 and the 2D electron gas 15 on both sides of the gate electrode 8 are connected. Accordingly, the source and the drain are conducted.

When used, for example, a predetermined voltage (e.g., 200 V to 300 V) making the drain electrode 12 positive is applied between the source electrode 11 and the drain electrode 12. In this state, an OFF voltage (e.g., 0 V) or an ON voltage (e.g., 3 V) is applied to the gate electrode 8, using the source electrode 11 as a reference potential (0 V).

FIGS. 2A to 2G are cross-sectional views illustrating an example of a manufacturing process of the aforementioned nitride semiconductor device 1, in which the cross-sectional structures in a plurality of steps of the manufacturing process are shown.

Figure 2A:
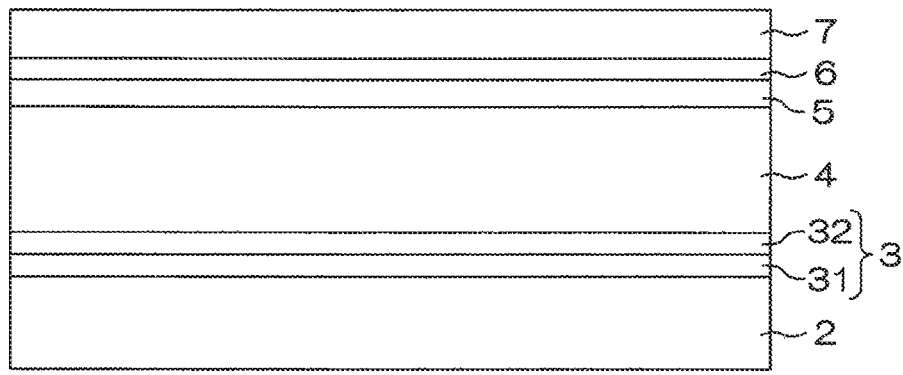
FIG. 2A is a cross-sectional view illustrating an example of a process of manufacturing the nitride semiconductor device.

First, as illustrated in FIG. 2A, the buffer layer 3 and the first nitride semiconductor layer (electron transit layer) 4 are sequentially and epitaxially grown on the substrate 2. And then, the second nitride semiconductor layer (electron supply layer) 5 is epitaxially grown on the first nitride semiconductor layer 4. Thereafter, the third nitride semiconductor layer 6 and the fourth nitride semiconductor layer 7 are sequentially and epitaxially grown on the second nitride semiconductor layer 5.

Figure 2B:
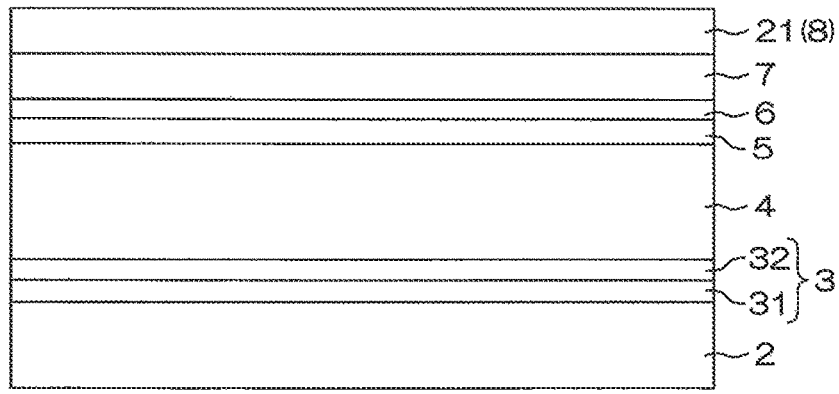
FIG. 2B is a cross-sectional view illustrating a next process of FIG. 2A.

Next, as illustrated in FIG. 2B, a gate electrode film 21 is formed on the fourth nitride semiconductor layer 7. The gate electrode film 21 is formed of, for example, a metal film of TiN.

Figure 2C:
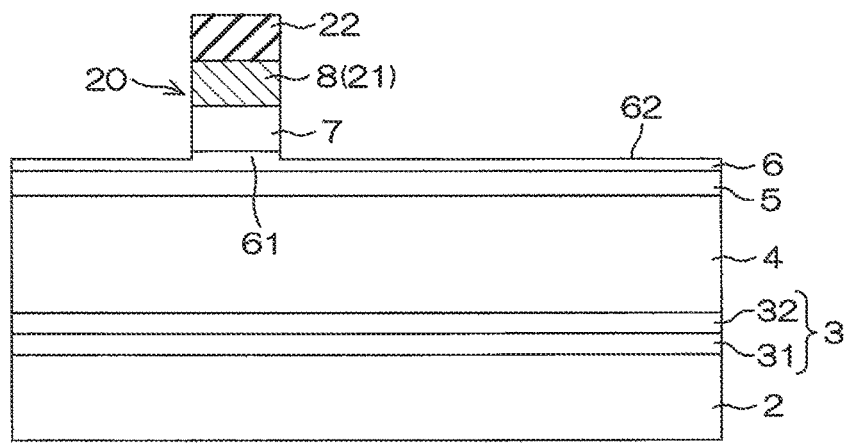
FIG. 2C is a cross-sectional view illustrating a next process of FIG. 2B.

Subsequently, as illustrated in FIG. 2C, a resist film 22 that covers a scheduled gate electrode forming region on a surface of the gate electrode film 21 is formed. Further, the gate electrode film 21, the fourth nitride semiconductor layer 7, and the third nitride semiconductor layer 6 are selectively etched using the resist film 22 as a mask. This etching is performed up to the middle of the third nitride semiconductor layer 6 in a thickness direction. That is to say, a portion up to the middle of the third nitride semiconductor layer 6 in the thickness direction is removed and the etching is stopped before the surface of the second nitride semiconductor layer 5 is exposed.

Thus, the gate electrode film 21 is patterned to obtain the gate electrode 8. Also, portions of the fourth nitride semiconductor layer 7 and the third nitride semiconductor layer 6 are patterned in the same pattern as that of the gate electrode 8. A thickness of a portion other than a portion directly below the gate electrode 8 in the third nitride semiconductor layer 6 is smaller than that of the portion directly below the gate electrode 8. Thus, the third nitride semiconductor layer 6 may include the thick portion 61 directly below the gate electrode 8 and the thin portion 62 other than the thick portion 61. In this manner, the gate part 20 including the fourth nitride semiconductor layer 7 and the gate electrode 8 is formed on the third nitride semiconductor layer 6.

Figure 2D:
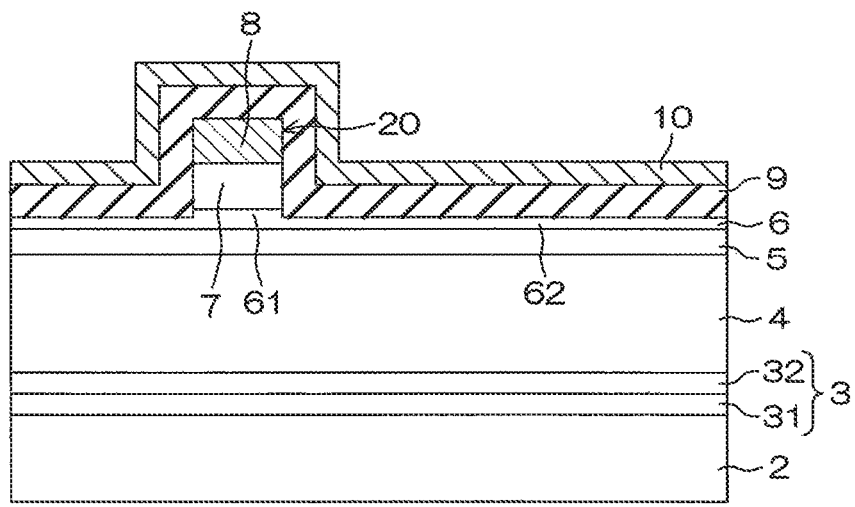
FIG. 2D is a cross-sectional view illustrating a next process of FIG. 2C.

Subsequently, the resist film 22 is removed. Thereafter, as illustrated in FIG. 2D, the passivation film 9 is formed to cover the entire exposed surface. And then, the barrier metal film 10 is formed on the surface of the passivation film 9.

The passivation film 9 is formed of, for example, an SiN layer. The barrier metal film 10 is formed of, for example, a TiN layer.

Figure 2E:
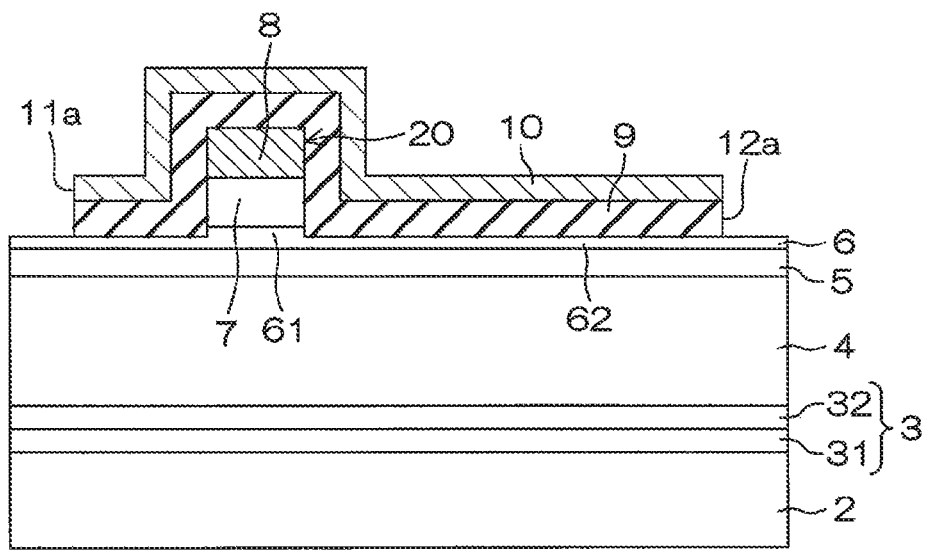
FIG. 2E is a cross-sectional view illustrating a next process of FIG. 2D.

Subsequently, as illustrated in FIG. 2E, the source electrode contact hole 11a and the drain electrode contact hole 12a are formed in the passivation film 9.

Figure 2F:
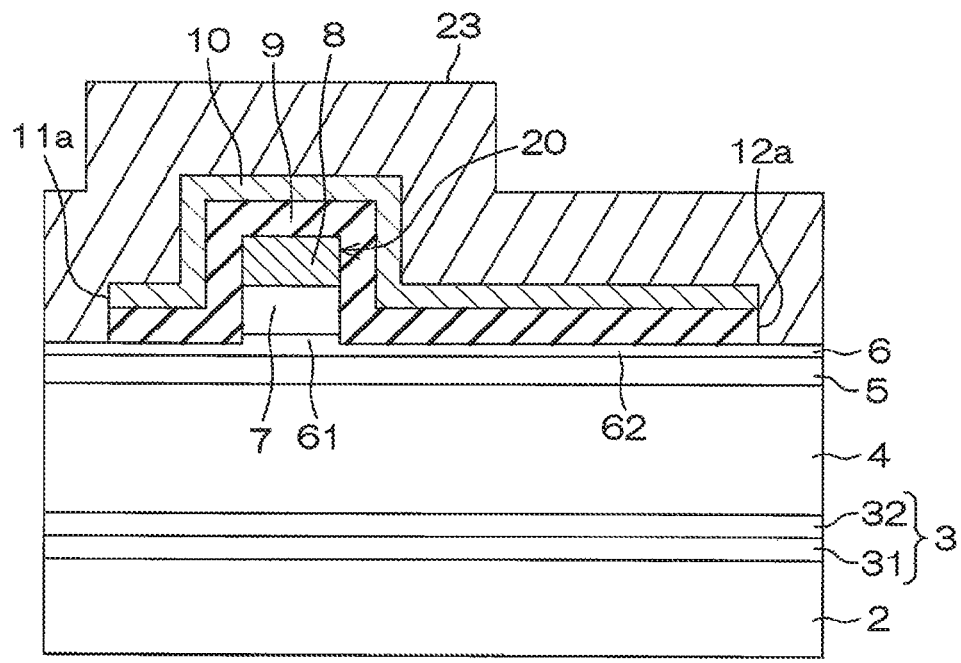
FIG. 2F is a cross-sectional view illustrating a next process of FIG. 2E.

Subsequently, as illustrated in FIG. 2F, a source/drain electrode film 23 is formed to cover the entire exposed surface. The source/drain electrode film 23 is formed as a stacked metal thin film by stacking a Ti layer as a lower layer, an Al layer as an intermediate layer, and a TiN layer as an upper layer, and formed by sequentially depositing the respective layers.

Figure 2G:
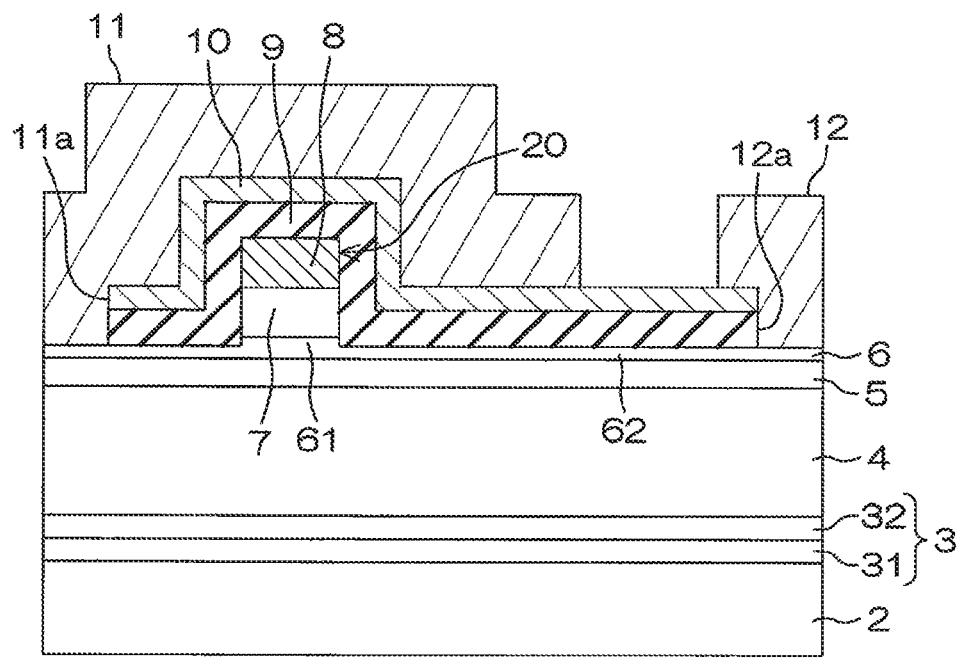
FIG. 2G is a cross-sectional view illustrating a next process of FIG. 2F.

Subsequently, as illustrated in FIG. 2G, the source/drain electrode film 23 is patterned through etching and annealed to form the source electrode 11 and the drain electrode 12 that are in ohmic-contact with the third nitride semiconductor layer 6. Thus, it is possible to obtain the nitride semiconductor device 1 having the structure as illustrated in FIG. 1.

During the process of forming the gate part 20 illustrated in FIG. 2C, etching is performed on the gate electrode film 21, the fourth nitride semiconductor layer 7, and the third nitride semiconductor layer 6 until the portion up to the middle of the third nitride semiconductor layer 6 in the thickness direction is selectively removed. However, this etching may also be performed until the surface of the second nitride semiconductor layer 5 is exposed.

Figure 3:
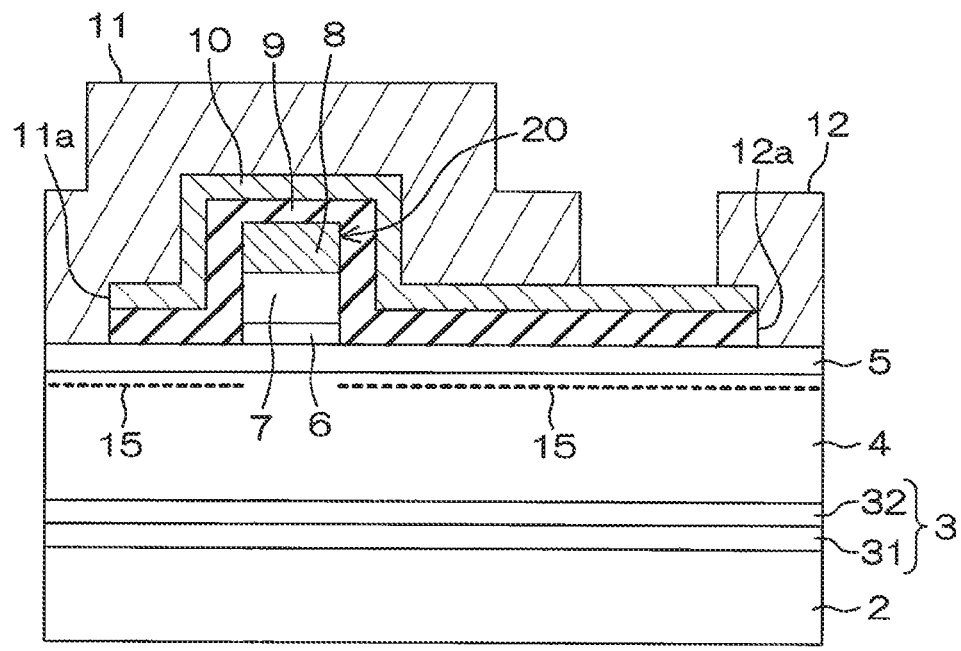
FIG. 3 is a cross-sectional view illustrating the configuration of a nitride semiconductor device according to a second embodiment of the present disclosure.

FIG. 3 is a cross-sectional view illustrating the configuration of a nitride semiconductor device according to a second embodiment of the present disclosure. In FIG. 3, parts corresponding to the respective parts of FIG. 1 described above will be denoted by the same reference numerals as those of FIG. 1.

A nitride semiconductor device 1A illustrated in FIG. 3 is a nitride semiconductor device that may be obtained when etching is performed until the surface of the second nitride semiconductor layer 5 is exposed during the process of forming the gate part 20 described above. In FIG. 3, for the convenience of description, the nitride semiconductor device 1A that may be obtained under the assumption that the surface of the second nitride semiconductor layer 5 is not etched and the third nitride semiconductor layer 6 is selectively etched until the surface of the second nitride semiconductor layer 5 is exposed during the process of forming the gate part 20 is illustrated. In the nitride semiconductor device 1A, the third nitride semiconductor layer 6 is present directly below the gate part 20, but the nitride semiconductor layer 6 is not present in a region other than a region directly below the gate part 20.

In the nitride semiconductor devices 1 and 1A according to the first and second embodiments described above, the third nitride semiconductor layer 6 having a band gap greater (having a high Al composition) than that of the first nitride semiconductor layer (electron transit layer) 4 and having a band gap smaller (having a low Al composition) than that of the second nitride semiconductor layer 5 is formed on the second nitride semiconductor layer (electron supply layer) 5. Further, the gate electrode 8 is installed on the third nitride semiconductor layer 6 through the fourth nitride semiconductor layer 7. Thus, it is possible to reduce the etching depth precision required when the gate part 20 is formed. Hereinafter, the reason will be described in detail.

Figure 4:
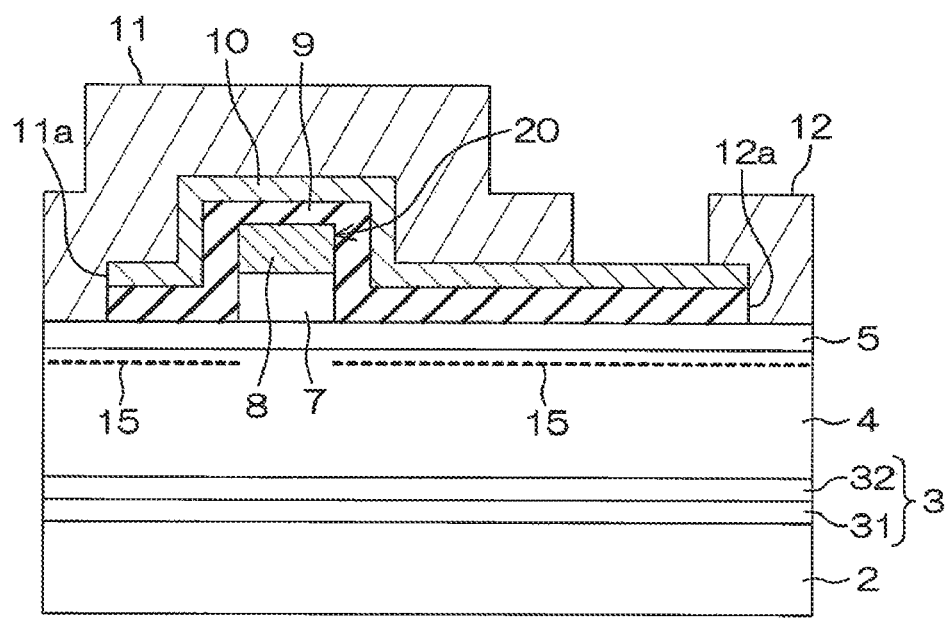
FIG. 4 is a cross-sectional view illustrating the configuration of a nitride semiconductor device according to a comparison example.

Regarding the nitride semiconductor device 1 of FIG. 1, a nitride semiconductor device having a configuration in which the third nitride semiconductor layer 6 is not installed will be used as a comparative example. FIG. 4 is a cross-sectional view illustrating the configuration of a nitride semiconductor device 101 according to a comparative example. In the nitride semiconductor device 101 according to the comparative example, a fourth nitride semiconductor layer 7 is formed on a portion of the second nitride semiconductor layer 5, and a gate electrode 8 is installed thereon. Thus, in the nitride semiconductor device 101 according to the comparative example, a gate part 20 including the fourth nitride semiconductor layer 7 and the gate electrode 8 is formed on the second nitride semiconductor layer 5. The gate part 20 is formed by forming the fourth nitride semiconductor layer 7 and a gate electrode film on the second nitride semiconductor layer 5 and then selectively etching the gate electrode film and the fourth nitride semiconductor layer 7.

First, the reason why high precision is required for an etching depth during the process of forming the gate part 20 in the comparative example in which the third nitride semiconductor layer 6 is not installed will be described.

In the comparative example, during the process of forming the gate part 20, there is a possibility that etching is performed even on a portion up to the middle of the second nitride semiconductor layer 5 in the thickness direction in a region other than the region directly below the gate part 20. Then, since a film thickness of the second nitride semiconductor layer 5 becomes smaller than its original film thickness, the polarization of the second nitride semiconductor layer 5 is reduced. As a result, the density of a 2D electron gas (sheet carrier density) is reduced.

Figure 5:
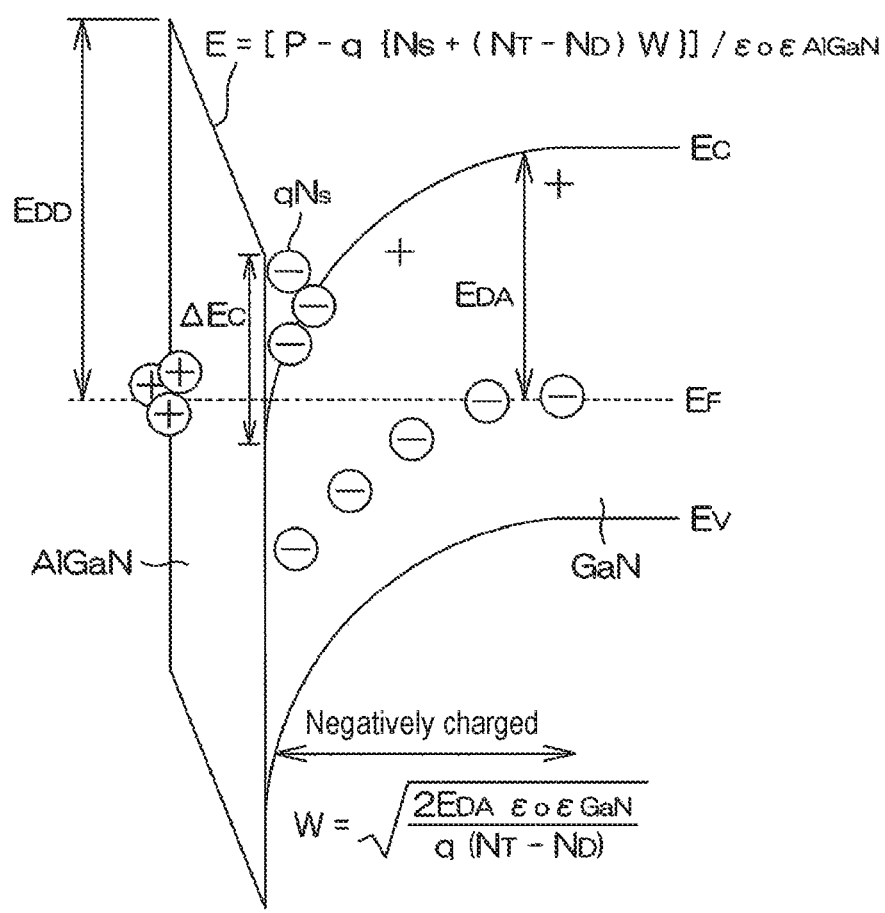
FIG. 5 is an energy band diagram illustrating an energy distribution when etching is performed on a portion up to the middle of a second nitride semiconductor layer in a thickness direction in a region other than a region directly below a gate part during a gate part forming process of the comparative example.

FIG. 5 is an energy band diagram illustrating an energy distribution when etching is performed on a portion up to the middle of a second nitride semiconductor layer in a thickness direction in a region other than a region directly below a gate part during the gate part forming process of the comparative example. In FIG. 5, GaN represents the first nitride semiconductor layer 4, and AlGaN represents the second nitride semiconductor layer 5. In FIG. 5, E represents an internal electric field of AlGaN.

In the region other than the region directly below the gate part 20, as illustrated in FIG. 5, an energy level $E_C$ of a conduction band of the first nitride semiconductor layer 4 in an interface between the first nitride semiconductor layer 4 and the second nitride semiconductor layer 5 becomes lower than a Fermi level $E_F$, and a 2D electron gas is generated within the first nitride semiconductor layer 4.

In this case, a surface donor level $E_{DD}$ is expressed by the following Eq. (1), and thus, a density $N_S$ of the 2D electron gas (sheet carrier density) is expressed by the following Eq. (2):

$$E_{DD} = \frac{d}{\varepsilon_o \varepsilon_{AlGaN}} [P - q\{N_S + (N_T - N_D)W\}] + \Delta E_C \quad \text{Eq. (1)}$$

$$W = \sqrt{\frac{2E_{DA}\varepsilon_o\varepsilon_{GaN}}{q(N_T - N_D)}}$$

$$N_s = \frac{P}{q} - \frac{\varepsilon_{AlGaN}\varepsilon_o}{qd}(E_{DD} - \Delta E_C) - (N_T - N_D)W \quad \text{Eq. (2)}$$

In Eq. (1), the symbols are defined as follows:
q: basic quantity of electric charge
$N_S$: density of 2D electron gas
$E_{DD}$: surface donor level
$\Delta E_C$: energy difference between conduction bands of AlN and GaN
d: film thickness of AlGaN ∈₀: vacuum permittivity
∈_{AlGaN}: dielectric constant of AlGaN
∈_{GaN}: dielectric constant of GaN
N_T: deep acceptor density of GaN
E_{DA}: deep acceptor level of GaN
N_D: donor density of GaN
W: width in which deep acceptor of GaN emits holes by polarization of AlGaN
P: difference in polarization between AlGaN and GaN (total polarization in interface of AlGaN/GaN)

$$P = P_{sp(AlGaN)} + P_{pz(AlGaN)} - P_{sp(GaN)}$$

P_{sp(AlGaN)}: spontaneous polarization of AlGaN
P_{pz(AlGaN)}: piezoelectric polarization of AlGaN
P_{sp(GaN)}: spontaneous polarization of GaN From Eq. (2), it can be seen that the density of 2D electron gas is reduced when a film thickness d of the second nitride semiconductor layer (AlGaN layer) 5 is reduced.

Figure 6:
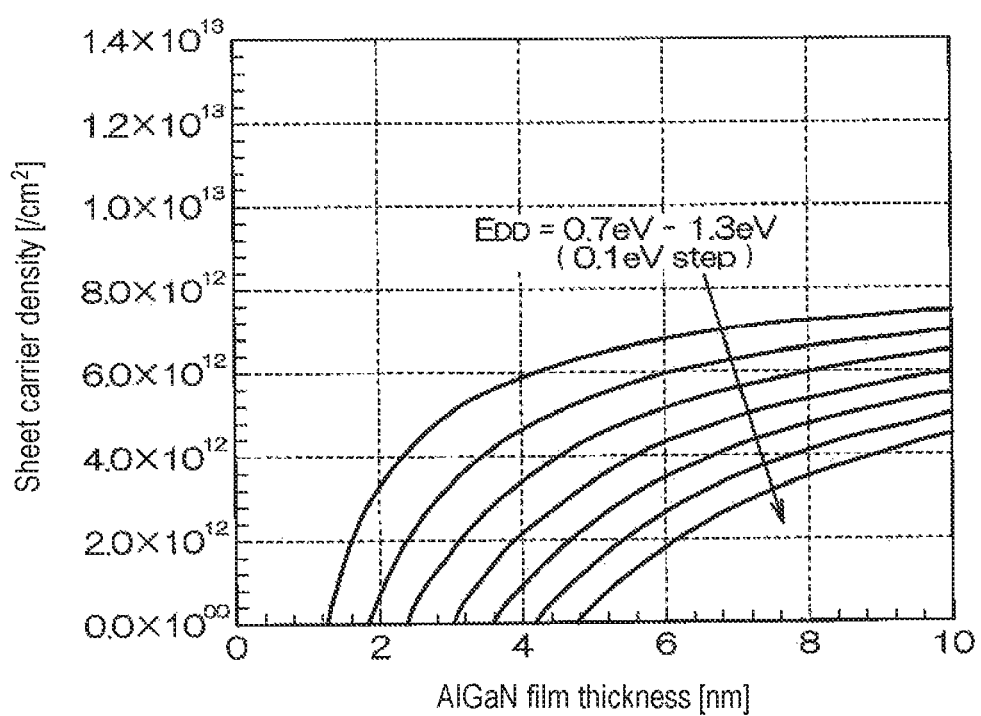
FIG. 6 is a graph illustrating the characteristics of a density Ns of a 2D electron gas (sheet carrier density) with respect to a film thickness of the second nitride semiconductor layer in the region other than the region directly below the gate part of the comparative example, based on a surface donor level $E_{DD}$ as a parameter.

FIG. 6 is a graph illustrating the characteristics of a density Ns of a 2D electron gas (sheet carrier density) with respect to a film thickness of the second nitride semiconductor layer in the region other than the region directly below the gate part of the comparative example, based on a surface donor level E_{DD} as a parameter. The surface donor level E_{DD} is changed from 0.7 eV to 1.3 eV by 0.1 eV each time. An Al composition of the second nitride semiconductor layer (AlGaN layer) 5 is 20%.

From FIG. 6, it can be seen that the density N_S of the 2D electron gas is significantly changed depending on a film thickness of the second nitride semiconductor layer 5 when etching is performed on a portion up to the middle of the second nitride semiconductor layer 5 in the thickness direction in the region other than the region directly below the gate part 20.

Further, in the comparative example, there is a possibility that the fourth nitride semiconductor layer 7 remains on the second nitride semiconductor layer 5 in the region other than the region directly below the gate part 20 during the process of forming the gate part 20.

Figure 7:
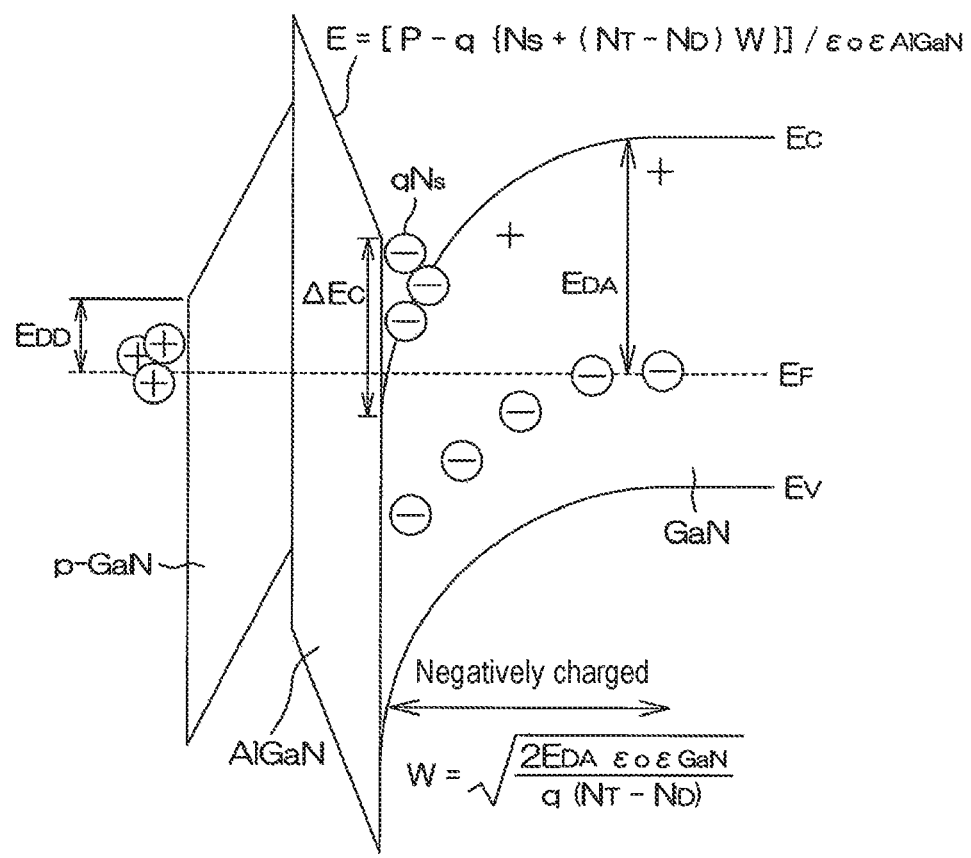
FIG. 7 is an energy band diagram illustrating an energy distribution when a fourth nitride semiconductor layer remains on the second nitride semiconductor layer in the region other than the region directly below the gate part during the gate part forming process of the comparative example.

FIG. 7 is an energy band diagram illustrating an energy distribution when the fourth nitride semiconductor layer remains on the second nitride semiconductor layer in the region other than the region directly below the gate part during the gate part forming process of the comparative example. In FIG. 7, GaN represents the first nitride semiconductor layer 4, AlGaN represents the second nitride semiconductor layer 5, and p-GaN represents the fourth nitride semiconductor layer 7. In FIG. 7, E represents an internal electric field of AlGaN.

In the region other than the region directly below the gate part 20, even when the fourth nitride semiconductor layer 7 remains on the second nitride semiconductor layer 5, a 2D electron gas is generated within the first nitride semiconductor layer 4. Due to the 2D electron gas, an electric field in the direction toward the surface of the second nitride semiconductor layer 5 from a surface on the opposite side of the second nitride semiconductor layer (AlGaN layer) 5 is generated within the fourth nitride semiconductor layer (p-GaN layer) 7. In other words, an electric field having a slope inclined to the right upward in FIG. 7 is generated within the fourth nitride semiconductor layer (p-GaN layer) 7. Due to this electric field, since an energy level E_C of a conduction band of the first nitride semiconductor layer 4 and the second nitride semiconductor layer 5 is raised, the 2D electron gas is reduced.

In this case, the density N_S of the 2D electron gas (sheet carrier density) is expressed by the following Eq. (3):

$$N_S = \frac{\left\{\frac{Pd_{AlGaN}}{q\varepsilon_o\varepsilon_{AlGaN}} - \frac{NAd_{GaN}}{2\varepsilon_o\varepsilon_{GaN}} - \frac{E_{DD}}{q}\right\}}{\left(\frac{d_{AlGaN}}{\varepsilon_o\varepsilon_{AlGaN}} + \frac{d_{GaN}}{\varepsilon_o\varepsilon_{GaN}}\right)} - (N_T - N_D)W \quad \text{Eq. (3)}$$

$$W = \sqrt{\frac{2E_{DA}\varepsilon_o\varepsilon_{GaN}}{q(N_T - N_D)}}$$

In Eq. (3), the symbols are defined as follows:
q: basic quantity of electric charge
N_S: density of 2D electron gas
E_{DD}: surface donor level
ΔE_G: energy difference between conduction bands of AlGaN and GaN
∈₀: vacuum permittivity
∈_{AlGaN}: dielectric constant of AlGaN
∈_{GaN}: dielectric constant of GaN
d_{AlGaN}: film thickness of AlGaN
d_{GaN}: film thickness of p-GaN
N_T: deep acceptor density of GaN
E_{DA}: deep acceptor level of GaN
N_D: donor density of GaN
W: width in which deep acceptor of GaN emits holes by polarization of AlGaN
P: difference in polarization between AlGaN and GaN (total polarization in interface of AlGaN/GaN)

$$P = P_{sp(AlGaN)} + P_{pz(AlGaN)} - P_{sp(GaN)}$$

P_{sp(AlGaN)}: spontaneous polarization of AlGaN
P_{pz(AlGaN)}: piezoelectric polarization of AlGaN
P_{sp(GaN)}: spontaneous polarization of GaN
N_A: acceptor concentration of p-GaN From Eq. (3), it can be seen that the density of 2D electron gas is reduced when a film thickness d_{GaN} of the fourth nitride semiconductor layer (p-GaN layer) 7 remaining on the second nitride semiconductor layer 5 is increased in the region other than the region directly below the gate part.

Figure 8:
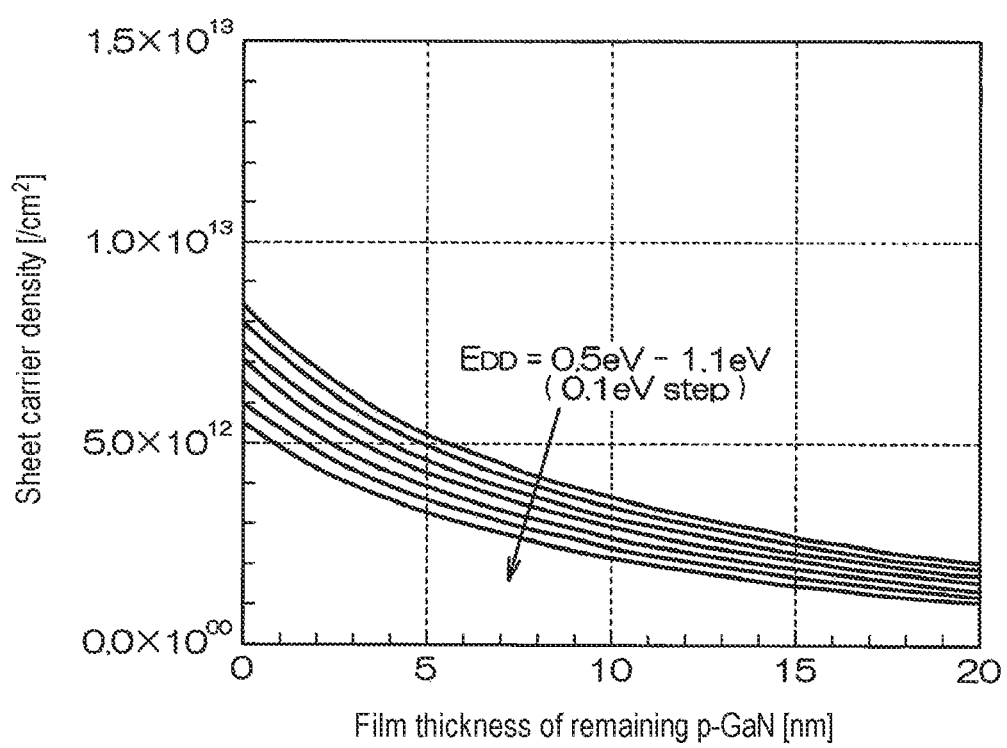
FIG. 8 is a graph illustrating the characteristics of a density Ns of a 2D electron gas (sheet carrier density) with respect to a film thickness of the fourth nitride semiconductor layer (film thickness of remaining p-GaN) remaining on the second nitride semiconductor layer in the region other than the region directly below the gate part of the comparative example, based on a surface donor level $E_{DD}$ as a parameter.

FIG. 8 is a graph illustrating the characteristics of a density Ns of a 2D electron gas (sheet carrier density) with respect to a film thickness of the fourth nitride semiconductor layer (film thickness of remaining p-GaN) remaining on the second nitride semiconductor layer in the region other than the region directly below the gate part of the comparative example, based on a surface donor level E_{DD} as a parameter. The surface donor level E_{DD} is changed from 0.5 eV to 1.1 eV by 0.1 eV each time. An Al composition of the second nitride semiconductor layer (AlGaN layer) 5 is 20%, and a film thickness thereof is 10 nm.

From FIG. 8, it can be seen that the density N_S of the 2D electron gas is significantly changed depending on a film thickness of the fourth nitride semiconductor layer 7 when the fourth nitride semiconductor layer 7 remains on the second nitride semiconductor layer 5 in the region other than the region directly below the gate part 20.

That is to say, in the comparative example, during the process of forming the gate part 20, the density N_S of the 2D electron gas is significantly changed in either case where etching is performed on a portion up to the middle of the second nitride semiconductor layer 5 in the thickness direction or the fourth nitride semiconductor layer 7 remains on the second nitride semiconductor layer 5, in the region other than the region directly below the gate part 20. Therefore, in the comparative example, high precision is required in obtaining a proper etching depth during the process of forming the gate part 20.

In contrast, in the first and second embodiments, the third nitride semiconductor layer (low Al composition AlGaN layer) 6 is formed on the second nitride semiconductor layer (AlGaN layer) 5. Therefore, when etching is performed on a portion up to the middle of the third nitride semiconductor layer 6 in the thickness direction during the process of forming the gate part 20, a surface part of the second nitride semiconductor layer 5 is etched in the region other than the region directly below the gate part 20 and the fourth nitride semiconductor layer 7 does not remain. Thus, the etching depth precision is reduced by at least a film thickness of the third nitride semiconductor layer 6 during the process of forming the gate part 20.

In this manner, since the third nitride semiconductor layer 6 is formed on the second nitride semiconductor layer 5, the third nitride semiconductor layer 6 is present directly below the gate part 20. However, since an Al composition of the third nitride semiconductor layer 6 is lower than that of the second nitride semiconductor layer 5, there is a small influence on the effect of canceling out the 2D electron gas by the fourth nitride semiconductor layer 7 at the time of zero biasing.

Further, even though the third nitride semiconductor layer 6 remains on the second nitride semiconductor layer 5 in the region other than the region directly below the gate part 20 during the process of forming the gate part 20, there is a small influence on the density of the 2D electron gas within the first nitride semiconductor layer 4.

Figure 9:
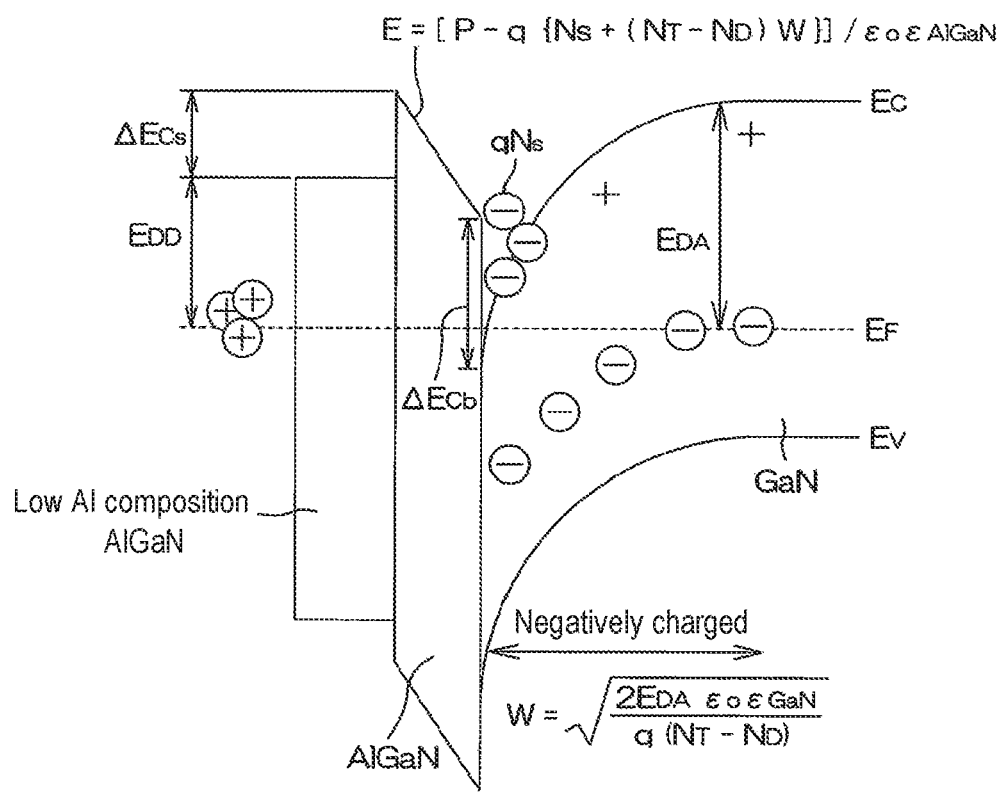
FIG. 9 is an energy band diagram illustrating an energy distribution when a third nitride semiconductor layer remains on a second nitride semiconductor layer in a region other than a region directly below a gate part during a gate part forming process of the first embodiment.

FIG. 9 is an energy band diagram illustrating an energy distribution when the third nitride semiconductor layer remains on the second nitride semiconductor layer in the region other than the region directly below the gate part during the gate part forming process of the first embodiment. In FIG. 9, GaN represents the first nitride semiconductor layer 4, AlGaN represents the second nitride semiconductor layer 5, and low Al composition AlGaN represents the third nitride semiconductor 6. In FIG. 9, E represents an internal electric field of AlGaN.

When the third nitride semiconductor layer 6 remains on the second nitride semiconductor layer 5 in the region other than the region directly below the gate part 20, an electric field based on the 2D electron gas within the first nitride semiconductor layer 4 and an electric field based on the polarization of the third nitride semiconductor layer 6 are generated within the third nitride semiconductor layer (low Al composition AlGaN layer) 6. A direction of the electric field based on the 2D electron gas is a direction from a surface on an opposite side of the second nitride semiconductor layer (AlGaN layer) 5 toward a surface on the second nitride semiconductor layer 5 side, in the third nitride semiconductor layer 6. That is, the slope of the electric field based on the 2D electron gas is inclined to the right upward in FIG. 9.

In contrast, a direction of the electric field based on the polarization of the third nitride semiconductor layer 6 is a direction from a surface of the second nitride semiconductor layer (AlGaN layer) 5 side to the surface on the opposite side of the second nitride semiconductor layer 5, in the third nitride semiconductor layer 6. That is, the slope of the electric field based on the polarization of the third nitride semiconductor layer 6 is inclined to the left upward in FIG. 9. Therefore, since these electric fields are canceled out, an electric field within the third nitride semiconductor layer 6 is flat in the thickness direction. Accordingly, even though the third nitride semiconductor layer 6 remains on the second nitride semiconductor layer 5 in the region other than the region directly below the gate part 20, the energy level $E_C$ of the conduction band of the first nitride semiconductor layer 4 and the second nitride semiconductor layer 5 is rarely changed, and thus, a change in the density of the 2D electron gas is small.

In this case, the density $N_S$ of the 2D electron gas (sheet carrier density) is expressed by the following Eq. (4):

$$N_S = \frac{\left(\dfrac{P_b d_b}{\varepsilon_o \varepsilon_b} - \dfrac{P_s d_s}{\varepsilon_o \varepsilon_s} + \Delta E_{cb} - \Delta E_{cs}\right)}{\left(\dfrac{q d_b}{\varepsilon_o \varepsilon_b} + \dfrac{q d_s}{\varepsilon_o \varepsilon_s}\right)} - (N_T - N_D)W \qquad \text{Eq. (4)}$$

$$W = \sqrt{\frac{2 E_{DA} \varepsilon_o \varepsilon_{GaN}}{q(N_T - N_D)}}$$

In Eq. (4), the symbols are defined as follows:
q: basic quantity of electric charge
$N_S$: density of 2D electron gas
$E_{DD}$: surface donor level
$\Delta E_{Cb}$: energy difference between conduction bands of AlGaN (electron supply layer) and GaN
$\Delta E_{Cs}$: energy difference between conduction bands of low Al composition AlGaN and AlGaN (electron supply layer)
$\varepsilon_o$: vacuum permittivity
$\varepsilon_s$: dielectric constant of low Al composition AlGaN
$\varepsilon_b$: dielectric constant of AlGaN (electron supply layer)
$d_s$: film thickness of low Al composition AlGaN
$d_b$: film thickness of AlGaN (electron supply layer)
$N_T$: deep acceptor density of GaN
$E_{DA}$: deep acceptor level of GaN
$N_D$: donor density of GaN
W: width in which deep acceptor of GaN emits holes by polarization of AlGaN
$P_b$: difference in polarization between AlGaN (electron supply layer) and GaN (total polarization in interface of AlGaN/GaN)

$$P = P_{sp(AlGaN)} + P_{pz(AlGaN)} - P_{sp(GaN)}$$

Figure 10:
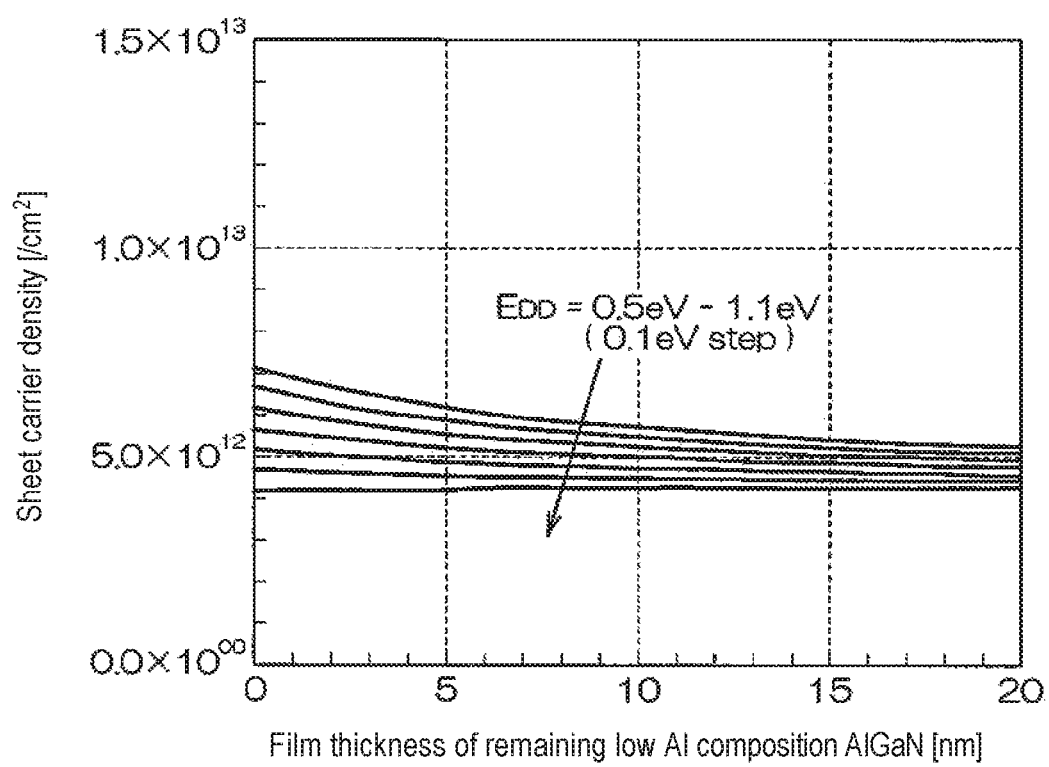
FIG. 10 is a graph illustrating the characteristics of a density Ns of a 2D electron gas density (sheet carrier density) with respect to a film thickness of the third nitride semiconductor layer (film thickness of remaining low Al composition AlGaN) remaining on the second nitride semiconductor layer in the region other than the region directly below the gate part of the first embodiment, based on a surface donor level $E_{DD}$ as a parameter.

$P_{sp(AlGaN)}$: spontaneous polarization of AlGaN (electron supply layer)
$P_{pz(AlGaN)}$: piezoelectric polarization of AlGaN (electron supply layer)
$P_{sp(GaN)}$: spontaneous polarization of GaN
$P_s$: difference in polarization between low Al composition AlGaN and GaN FIG. 10 is a graph illustrating the characteristics of a density Ns of a 2D electron gas (sheet carrier density) with respect to a film thickness of the third nitride semiconductor layer (film thickness of remaining low Al composition AlGaN) remaining on the second nitride semiconductor layer in the region other than the region directly below the gate part of the first embodiment, based on a surface donor level $E_{DD}$ as a parameter. The surface donor level $E_{DD}$ is changed from 0.5 eV to 1.1 eV by 0.1 eV each time. An Al composition of the second nitride semiconductor layer (AlGaN layer) 5 is 20%, and a film thickness thereof is 10 nm.

From FIG. 10, it can be seen that the density $N_S$ of the 2D electron gas did not change much, regardless of a film thickness of the third nitride semiconductor layer 6, even though the third nitride semiconductor layer 6 remains on the second nitride semiconductor layer 5 in the region other than the region directly below the gate part 20.

Figure 11:
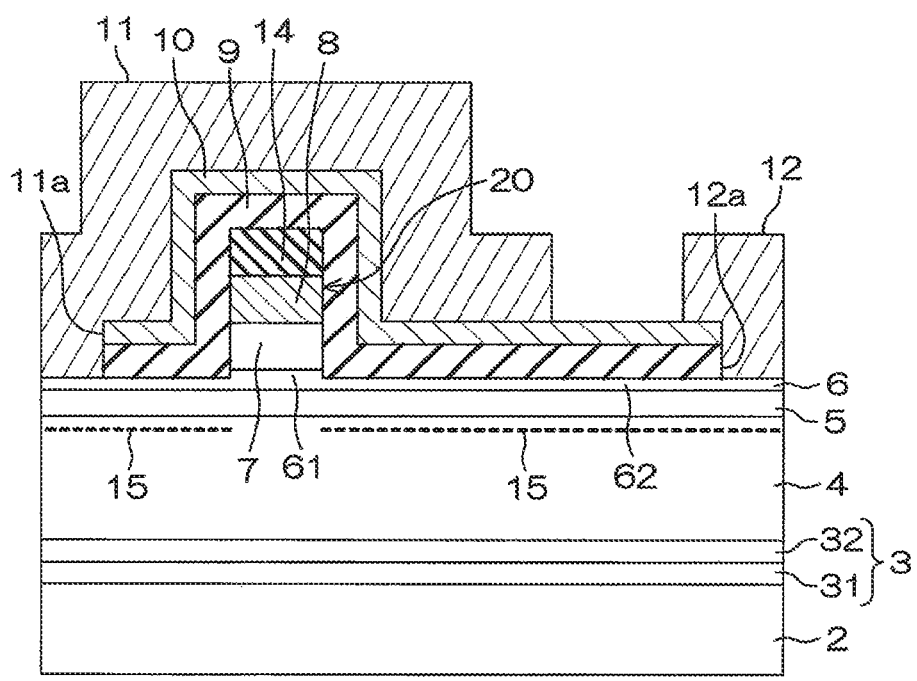
FIG. 11 is a cross-sectional view illustrating a nitride semiconductor device according to a third embodiment of the present disclosure.

FIG. 11 is a cross-sectional view illustrating a nitride semiconductor device according to a third embodiment of the present disclosure. In FIG. 11, parts corresponding to the respective parts of FIG. 1 described above are denoted by the same reference numerals as those of FIG. 1.

A nitride semiconductor device 1B illustrated in FIG. 11 is different from the nitride semiconductor device 1 illustrated in FIG. 1, in that a low-k film 14 is installed on a gate electrode 8. The low-k film 14 is formed of, for example, a dielectric material having a dielectric constant of 5 or less. In this embodiment, the low-k film 14 is an $SiO_2$ film. A surface and a side surface of the low-k film 14 are covered by a passivation film 9. In the nitride semiconductor device 1B, since the low-K film 14 is installed between a source electrode 11 and the gate electrode 8, the capacity between the source electrode 11 and the gate electrode 8 can be reduced.

The nitride semiconductor device 1B is manufactured through substantially the same method as that of the nitride semiconductor device 1 illustrated in FIG. 1. However, the process of forming the gate part 20 of FIG. 2C and the process of forming the passivation film 9 of FIG. 2D are slightly different.

In the nitride semiconductor device 1 illustrated in FIG. 1, the resist film 22 that covers a scheduled gate forming region on the gate electrode film 21 is formed as illustrated in FIG. 2C. Subsequently, the gate electrode film 21, the fourth nitride semiconductor layer 7, and the third nitride semiconductor layer 6 are selectively etched using the resist film 22 as a mask. Further, after the resist film 22 is removed, the passivation film 9 is formed to cover the entire exposed surface, as illustrated in FIG. 2D.

In contrast, in the nitride semiconductor device 1B, a material film (low-k material film) of the low-k film 14 is formed on the gate electrode film 21. The low-k material film is, for example, an $SiO_2$ film. Thereafter, the low-k material film is selectively etched, and there remains only a portion (low-k film 14) of the low-k material film which covers the scheduled gate forming region on the gate electrode film 21. Thereafter, the gate electrode film 21, the fourth nitride semiconductor layer 7, and the third nitride semiconductor layer 6 are etched using the remaining low-k material film (low-K film 14) as a mask. Further, in a state where only the low-K film 14 remains, the passivation film 9 is formed to cover the entire exposed surface.

In the existing technology without the low Al composition AlGaN layer, the formation of the low-k film leads to an increase in a total etching depth and to a severe difficulty in controlling an etching depth, degrading a product yield. However, in this embodiment in which the low Al composition AlGaN layer (third nitride semiconductor layer 6) is formed, in spite of the formation of the low-k film 14, a tolerance of the etching depth is permitted, thereby stably manufacturing the nitride semiconductor device without degrading a product yield.

While the first, the second, and the third embodiments of the present disclosure have been described above, the present disclosure may be differently embodied. For example, in the aforementioned first to third embodiments, the example in which the first nitride semiconductor layer (electron transit layer) 4 is formed as the GaN layer and the second nitride semiconductor layer (electron supply layer) 5 is formed as the AlGaN layer has been described. However, as long as the first nitride semiconductor layer 4 and the second nitride semiconductor layer 5 have different band gaps (for example, Al compositions), any other combinations may also be used. For example, a combination of the nitride semiconductor layer 4 and the second nitride semiconductor layer 5 may be a GaN/AlN, an AlGaN/AlN, or the like.

Further, in the aforementioned first to third embodiments, the example in which the third nitride semiconductor layer 6 is formed as the low Al composition AlGaN layer having an Al composition lower than that of the second nitride semiconductor layer 5 has been described. However, the third nitride semiconductor layer 6 may be formed of any other nitride semiconductor as long as it has a band gap greater than that of the first nitride semiconductor layer 4 and smaller than that of the second nitride semiconductor layer 5. For example, in a case where the second nitride semiconductor layer 5 is formed as an AlGaN layer, the third nitride semiconductor layer 6 may be formed as an AlInGaN layer. Also, in a case where the second nitride semiconductor layer 5 is formed as an AlN layer, the third nitride semiconductor layer 6 may be formed as an AlN layer having an Al composition lower than that of the second nitride semiconductor layer 5.

Further, in the aforementioned first to third embodiments, silicon is applied as a material example of the substrate 2, but in addition, a certain substrate material such as a sapphire substrate or a GaN substrate may also be applied.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A nitride semiconductor device, comprising:
   a first nitride semiconductor layer serving as an electron transit layer;
   a second nitride semiconductor layer formed on the first nitride semiconductor layer, the second nitride semiconductor layer having a band gap greater than that of the first nitride semiconductor layer and serving as an electron supply layer;
   a third nitride semiconductor layer formed on the second nitride semiconductor layer, the third nitride semiconductor layer having a band gap greater than that of the first nitride semiconductor layer and smaller than that of the second nitride semiconductor layer; and
   a gate part formed on the third nitride semiconductor layer,
   wherein the gate part comprises a fourth nitride semiconductor layer formed on the third nitride semiconductor layer and including an acceptor type impurity, and a gate electrode formed on the fourth nitride semiconductor layer.

2. The device of claim 1, wherein the third nitride semiconductor layer is formed in a region directly below the gate part on the second nitride semiconductor layer and in at least a portion of a region other than the region directly below the gate part on the second nitride semiconductor layer.

3. The device of claim 2, wherein a thickness of the third nitride semiconductor layer formed in at least a portion of the region other than the region directly below the gate part is smaller than that of the third nitride semiconductor layer formed in the region directly below the gate part.

4. The device of claim 1, wherein the third nitride semiconductor layer is formed only in a region directly below the gate part on the second nitride semiconductor layer.

5. The device of claim 1, wherein the first nitride semiconductor layer is formed of a GaN layer, the second nitride semiconductor layer is formed of an AlGaN layer, the third nitride semiconductor layer is formed of an AlGaN layer having an Al composition higher than that of the second nitride semiconductor layer, and the fourth nitride semiconductor layer is formed of a p-type GaN layer.

6. The device of claim 1, wherein the first nitride semiconductor layer is formed of a GaN layer, the second nitride semiconductor layer is formed of an AlGaN layer, the third nitride semiconductor layer is formed of an AlInGaN layer, and the fourth nitride semiconductor layer is formed of a p-type GaN layer.

7. The device of claim 1, further comprising an insulating film configured to cover the third nitride semiconductor layer, the fourth nitride semiconductor layer, and the gate electrode,
wherein the insulating film contains Si as a constituent element and comprises a layer in contact with the third nitride semiconductor layer.

8. The device of claim 1, wherein the first nitride semiconductor layer includes a first acceptor type impurity having a concentration of $4 \times 10^{16}$ cm$^{-3}$ or greater.

9. The device of claim 8, wherein the first acceptor type impurity is carbon.

10. The device of claim 1, wherein the fourth nitride semiconductor layer includes a second acceptor type impurity having a concentration of $3 \times 10^{17}$ cm$^{-3}$ or greater.

11. The device of claim 10, wherein the second acceptor type impurity is carbon or magnesium.

12. The device of claim 1, further comprising a low-k film formed on the gate electrode and formed of a dielectric material having a dielectric constant of 5 or less.

13. The device of claim 1, wherein the second nitride semiconductor layer is formed of an $Al_{x1}Ga_{1-x1}N$ layer (where $0<x1<1$); and
the third nitride semiconductor layer is formed of an $Al_{x2}Ga_{1-x2}N$ layer,
wherein x2 is a value within a range of $x1/3 \leq x2 \leq 2 \cdot x1/3$.

14. The device of claim 1, wherein the second nitride semiconductor layer is formed of an $Al_{x1}Ga_{1-x1}N$ layer; and
the third nitride semiconductor layer is formed of an $Al_{x2}Ga_{1-x2}N$ layer,
wherein x1 is a value within a range of $0.15 \leq x1 \leq 0.3$, and x2 is a value within a range of $0.05 \leq x2 \leq 0.2$.

15. The device of claim 1, wherein a film thickness of the second nitride semiconductor layer ranges from 10 nm to 20 nm; and
a film thickness of the third nitride semiconductor layer is 20 nm or less.

16. A method of manufacturing a nitride semiconductor device, comprising:
forming a first nitride semiconductor layer as an electron transit layer;
forming a second nitride semiconductor layer as an electron supply layer on the first nitride semiconductor layer, the second nitride semiconductor layer having a band gap greater than that of the first nitride semiconductor layer; and
forming a third nitride semiconductor layer on the second nitride semiconductor layer, the third nitride semiconductor layer having a band gap greater than that of the first nitride semiconductor layer and smaller than that of the second nitride semiconductor layer; and
forming a fourth nitride semiconductor layer including an acceptor type impurity on the third nitride semiconductor layer;
forming a gate electrode film on the fourth nitride semiconductor layer; and
forming a gate part including the fourth nitride semiconductor layer and a gate electrode on the third nitride semiconductor layer by selectively etching the gate electrode film, the fourth nitride semiconductor layer, and the third nitride semiconductor layer.

17. The method of claim 16, wherein, in the act of forming a gate part, etching is performed up to the middle of the third nitride semiconductor layer in a thickness direction from a surface of the electrode film.

18. The method of claim 16, further comprising:
after the act of forming a gate part, forming an insulating film configured to cover the third nitride semiconductor layer and the gate part;
forming a source electrode contact hole and a drain electrode contact hole in the insulating film;
forming a source/drain electrode film in the source electrode contact hole and the drain electrode contact hole and on the insulating film; and
forming a source electrode and a drain electrode by selectively etching the source/drain electrode film.

* * * * *